(12) United States Patent
Ulmer et al.

(10) Patent No.: US 10,236,279 B2
(45) Date of Patent: Mar. 19, 2019

(54) EMISSIVE DISPLAY WITH LIGHT MANAGEMENT SYSTEM

(71) Applicant: eLux Inc., Camas, WA (US)

(72) Inventors: Kurt Ulmer, Vancouver, WA (US); Paul J. Schuele, Washougal, WA (US); Kenji Sasaki, West Linn, OR (US); Jong-Jan Lee, Camas, WA (US)

(73) Assignee: eLux, Inc., Vancouver, WA (US)

( * ) Notice: Subject to any disclaimer, the term of this patent is extended or adjusted under 35 U.S.C. 154(b) by 0 days.

(21) Appl. No.: 15/410,195

(22) Filed: Jan. 19, 2017

(65) Prior Publication Data

US 2017/0133564 A1    May 11, 2017

Related U.S. Application Data

(63) Continuation-in-part of application No. 15/410,001, filed on Jan. 19, 2017, now Pat. No. 9,825,202, which is a continuation-in-part of application No. 14/749,569, filed on Jun. 24, 2015, now Pat. No. 9,722,145, and a continuation-in-part of application No. 15/221,571, filed on Jul. 27, 2016, now Pat. No. 9,755,110, and a continuation-in-part of application No. 15/197,266, filed on Jun. 29, 2016, and a
(Continued)

(51) Int. Cl.
*H01L 33/00* (2010.01)
*H01L 25/075* (2006.01)
*H01L 33/56* (2010.01)

(52) U.S. Cl.
CPC ........ *H01L 25/0753* (2013.01); *H01L 33/56* (2013.01); *H01L 2933/0058* (2013.01)

(58) Field of Classification Search
CPC ....... H01L 27/156; H01L 33/20; H01L 33/58; H01L 33/60
USPC ..................... 257/98, 99, 100, 88
See application file for complete search history.

(56) References Cited

U.S. PATENT DOCUMENTS 5,545,291 A    8/1996    Smith et al.
5,594,463 A    1/1997    Sakamoto
(Continued)

OTHER PUBLICATIONS

US 8,093,720, 01/10/2012, Sony (withdrawn).
(Continued)

*Primary Examiner* — Tan N Tran
(74) *Attorney, Agent, or Firm* — Law Office of Gerald Maliszewski; Gerald Maliszewski (57) ABSTRACT

A method is provided for fabricating an emissive display substrate with a light management system. The method provides a transparent first substrate with a top surface and forms a plurality of emissive element wells. The well sidewalls are formed from a light absorbing material or a light reflector material. In one aspect, a light blocking material film layer is formed overlying the first substrate top surface, and the emissive element sidewalls are formed in the light blocking material film layer. In another aspect, a transparent second substrate is formed overlying the first substrate top surface. Then, the emissive element wells are formed in the second substrate with via surfaces, and the light blocking material is deposited overlying the well via surfaces. Additionally, the light blocking material may be formed on the bottom surface of each well. An emissive display substrate with light management system is provided below.

26 Claims, 6 Drawing Sheets

Related U.S. Application Data continuation-in-part of application No. 15/190,813, filed on Jun. 23, 2016, now Pat. No. 9,892,944, and a continuation-in-part of application No. 15/158,556, filed on May 18, 2016, now Pat. No. 9,985,190, and a continuation-in-part of application No. 15/266,796, filed on Sep. 15, 2016, now Pat. No. 9,917,226, and a continuation-in-part of application No. 14/680,618, filed on Apr. 7, 2015, now Pat. No. 10,115,862, which is a continuation-in-part of application No. 14/530,230, filed on Oct. 31, 2014, now abandoned.

(56) References Cited

U.S. PATENT DOCUMENTS

| | | |
|---|---|---|
| 5,824,186 A | 10/1998 | Smith et al. |
| 5,904,545 A | 5/1999 | Smith et al. |
| 6,274,508 B1 | 8/2001 | Jacobsen et al. |
| 6,281,038 B1 | 8/2001 | Jacobsen et al. |
| 6,316,278 B1 | 11/2001 | Jacobsen et al. |
| 6,417,025 B1 | 7/2002 | Gengel |
| 6,420,266 B1 | 7/2002 | Smith et al. |
| 6,468,638 B2 | 10/2002 | Jacobsen et al. |
| 6,479,395 B1 | 11/2002 | Smith et al. |
| 6,527,964 B1 | 3/2003 | Smith et al. |
| 6,555,408 B1 | 4/2003 | Jacobsen et al. |
| 6,566,744 B2 | 5/2003 | Gengel |
| 6,586,338 B2 | 7/2003 | Smith et al. |
| 6,590,346 B1 | 7/2003 | Hadley et al. |
| 6,606,247 B2 | 8/2003 | Credelle et al. |
| 6,613,610 B2 | 9/2003 | Iwafuchi et al. |
| 6,618,030 B2 | 9/2003 | Kane et al. |
| 6,623,579 B1 | 9/2003 | Smith et al. |
| 6,657,289 B1 | 12/2003 | Craig et al. |
| 6,665,044 B1 | 12/2003 | Jacobsen et al. |
| 6,683,663 B1 | 1/2004 | Hadley et al. |
| 6,687,987 B2 | 2/2004 | Mayer et al. |
| 6,723,576 B2 | 4/2004 | Nozawa et al. |
| 6,731,353 B1 | 5/2004 | Credelle et al. |
| 6,780,696 B1 | 8/2004 | Schatz |
| 6,816,380 B2 | 11/2004 | Credelle et al. |
| 6,825,499 B2 | 11/2004 | Nakajima et al. |
| 6,835,960 B2 * | 12/2004 | Lin ................. H01L 33/486 257/100 |
| 6,850,312 B2 | 2/2005 | Jacobsen et al. |
| 6,863,219 B1 | 3/2005 | Jacobsen et al. |
| 6,870,190 B2 | 3/2005 | Okuyama et al. |
| 6,919,225 B2 | 7/2005 | Craig et al. |
| 6,927,085 B2 | 8/2005 | Hadley et al. |
| 6,980,184 B1 | 12/2005 | Stewart et al. |
| 6,984,927 B2 | 1/2006 | Tomoda et al. |
| 6,985,361 B2 | 1/2006 | Credelle et al. |
| 7,046,328 B2 | 5/2006 | Jacobsen et al. |
| 7,049,207 B2 | 5/2006 | Tomoda |
| 7,049,227 B2 | 5/2006 | Tomoda et al. |
| 7,060,542 B2 | 6/2006 | Nakajima et al. |
| 7,070,851 B2 | 7/2006 | Jacobsen et al. |
| 7,080,444 B1 | 7/2006 | Craig et al. |
| 7,087,934 B2 | 8/2006 | Oohata et al. |
| 7,101,502 B2 | 9/2006 | Smith et al. |
| 7,113,250 B2 | 9/2006 | Jacobsen et al. |
| 7,122,826 B2 | 10/2006 | Okuyama et al. |
| 7,129,514 B2 | 10/2006 | Okuyama et al. |
| 7,141,176 B1 | 11/2006 | Smith et al. |
| 7,172,789 B2 | 2/2007 | Smith et al. |
| 7,179,210 B2 | 2/2007 | Soukeras |
| 7,199,527 B2 | 4/2007 | Holman |
| 7,244,326 B2 | 7/2007 | Craig et al. |
| 7,250,314 B2 | 7/2007 | Nakajima et al. |
| 7,250,320 B2 | 7/2007 | Okuyama et al. |
| 7,260,882 B2 | 8/2007 | Credelle et al. |
| 7,288,432 B2 | 10/2007 | Jacobsen et al. |
| 7,317,211 B2 | 1/2008 | Watanabe et al. |
| 7,317,435 B2 | 1/2008 | Hsueh |
| 7,321,159 B2 | 1/2008 | Schatz |
| 7,353,598 B2 | 4/2008 | Craig et al. |
| 7,417,306 B1 | 8/2008 | Jacobsen et al. |
| 7,425,467 B2 | 9/2008 | Jacobsen et al. |
| 7,452,748 B1 | 11/2008 | Craig et al. |
| 7,500,610 B1 | 3/2009 | Hadley et al. |
| 7,531,218 B2 | 5/2009 | Smith et al. |
| 7,542,301 B1 | 6/2009 | Liong et al. |
| 7,561,221 B2 | 7/2009 | Jacobsen et al. |
| 7,564,064 B2 | 7/2009 | Oohata et al. |
| 7,572,649 B2 | 8/2009 | Kanemitsu et al. |
| 7,573,194 B2 | 8/2009 | Doi et al. |
| 7,576,656 B2 | 8/2009 | Craig et al. |
| 7,589,355 B2 | 9/2009 | Tomoda et al. |
| 7,615,479 B1 | 11/2009 | Craig et al. |
| 7,619,598 B2 | 11/2009 | Pulvirenti et al. |
| 7,662,008 B2 | 2/2010 | Hillis et al. |
| 7,750,563 B2 * | 7/2010 | Hasegawa ............... C09K 11/06 313/506 |
| 7,763,901 B2 | 7/2010 | Tomoda |
| 7,774,929 B2 | 8/2010 | Jacobs |
| 7,795,049 B2 | 9/2010 | Watanabe et al. |
| 7,795,629 B2 | 9/2010 | Watanabe et al. |
| 7,838,410 B2 | 11/2010 | Hirao et al. |
| 7,868,543 B2 * | 1/2011 | Kobayashi ............ H01L 51/5271 313/503 |
| 7,880,184 B2 | 2/2011 | Iwafuchi et al. |
| 7,884,543 B2 | 2/2011 | Doi |
| 7,888,690 B2 | 2/2011 | Iwafuchi et al. |
| 7,931,063 B2 | 4/2011 | Craig et al. |
| 7,968,474 B2 | 6/2011 | Martin et al. |
| 7,977,130 B2 | 7/2011 | Hillis et al. |
| 8,101,457 B2 | 1/2012 | Tomoda et al. |
| 8,222,659 B2 | 7/2012 | Tomoda |
| 8,232,640 B2 | 7/2012 | Tomoda et al. |
| 8,252,164 B2 | 8/2012 | Martin et al. |
| 8,257,538 B2 | 9/2012 | Doi et al. |
| 8,284,120 B2 | 10/2012 | Hillis et al. |
| 8,300,007 B2 | 10/2012 | Hillis et al. |
| 8,312,619 B2 | 11/2012 | Chow et al. |
| 8,333,860 B1 | 12/2012 | Bibl et al. |
| 8,349,116 B1 | 1/2013 | Bibl et al. |
| 8,361,268 B2 | 1/2013 | Mizuno et al. |
| 8,361,297 B2 | 1/2013 | Mayer et al. |
| 8,379,003 B2 | 2/2013 | Kawaguchi et al. |
| 8,382,544 B2 | 2/2013 | Hillis et al. |
| 8,383,506 B1 | 2/2013 | Golda et al. |
| 8,384,116 B2 | 2/2013 | Ohtorii et al. |
| 8,390,537 B2 | 3/2013 | Hillis et al. |
| 8,409,886 B2 | 4/2013 | Iwafuchi et al. |
| 8,415,767 B1 | 4/2013 | Golda et al. |
| 8,415,768 B1 | 4/2013 | Golda et al. |
| 8,415,771 B1 | 4/2013 | Golda et al. |
| 8,415,879 B2 | 4/2013 | Lowenthal et al. |
| 8,426,227 B1 | 4/2013 | Bibl et al. |
| 8,476,826 B2 | 7/2013 | Oohata et al. |
| 8,518,204 B2 | 8/2013 | Hu et al. |
| 8,552,436 B2 | 10/2013 | Bibl et al. |
| 8,558,243 B2 | 10/2013 | Bibl et al. |
| 8,569,115 B1 | 10/2013 | Golda et al. |
| 8,570,482 B2 | 10/2013 | Hillis et al. |
| 8,573,469 B2 | 11/2013 | Hu et al. |
| 8,628,994 B2 | 1/2014 | Tomoda |
| 8,646,505 B2 | 2/2014 | Bibl et al. |
| 8,648,328 B2 | 2/2014 | Crowder et al. |
| 8,669,703 B2 | 3/2014 | Hillis et al. |
| 8,683,416 B1 | 3/2014 | Trivedi et al. |
| 8,685,774 B2 | 4/2014 | Crowder et al. |
| 8,686,447 B2 | 4/2014 | Tomoda et al. |
| 8,686,542 B2 | 4/2014 | Golda et al. |
| 8,711,063 B2 | 4/2014 | Hillis et al. |
| 8,789,573 B2 | 7/2014 | Bibl et al. |
| 8,809,126 B2 | 8/2014 | Lowenthal et al. |
| 8,846,457 B2 | 9/2014 | Lowenthal et al. |
| 8,906,713 B2 | 12/2014 | Rettke |
| 9,159,892 B2 * | 10/2015 | Fukushima ............. H01L 33/62 |
| 9,178,123 B2 * | 11/2015 | Sakariya ............ H01L 25/0753 |
| 9,240,397 B2 | 1/2016 | Bibl et al. |
| 9,252,375 B2 | 2/2016 | Bibl et al. |
| 9,269,322 B2 | 2/2016 | Nathan et al. |

(56) References Cited

U.S. PATENT DOCUMENTS

| | | |
|---|---|---|
| 9,293,476 B2 | 3/2016 | Bedell et al. |
| 9,305,807 B2 | 4/2016 | Whiting et al. |
| 9,318,475 B2 | 4/2016 | Bibl et al. |
| 9,343,448 B2 | 5/2016 | Sakariya et al. |
| 2002/0153606 A1 | 10/2002 | Gengel |
| 2005/0206585 A1 | 9/2005 | Stewart et al. |
| 2005/0233504 A1 | 10/2005 | Doi et al. |
| 2010/0186883 A1 | 7/2010 | Tomoda |
| 2011/0266039 A1 | 11/2011 | Tomoda |
| 2011/0273410 A1 | 11/2011 | Park et al. |
| 2012/0169786 A1 | 7/2012 | Okuyama et al. |
| 2012/0218318 A1 | 8/2012 | Hirao et al. |
| 2013/0126098 A1 | 5/2013 | Bibl et al. |
| 2013/0126827 A1 | 5/2013 | Bibl et al. |
| 2013/0128585 A1 | 5/2013 | Bibl et al. |
| 2013/0210194 A1 | 8/2013 | Bibl et al. |
| 2014/0008691 A1 | 1/2014 | Tomoda et al. |
| 2014/0048909 A1 | 2/2014 | Golda et al. |
| 2014/0084482 A1 | 3/2014 | Hu et al. |
| 2015/0179877 A1 | 6/2015 | Hu et al. |
| 2015/0263066 A1 | 9/2015 | Hu et al. |
| 2016/0086534 A1 | 3/2016 | Seo et al. |

OTHER PUBLICATIONS

U.S. Appl. No. 14/305,295, pending, LED Display Driving Circuits.

Bui, Thanh Son, et al. "High optical density and low dielectric constant black matrix containing graphene oxide and carbon black . . . " Displays 34.3 (2013): 192-199.

Den Boer, Willem. Active matrix liquid crystal displays: fundamentals and applications. Elsevier, 2011.

* cited by examiner

EMISSIVE DISPLAY WITH LIGHT MANAGEMENT SYSTEM

RELATED APPLICATIONS

This application is a Continuation-in-part of application Ser. No. 15/410,001, invented by Schuele et al., entitled DISPLAY WITH SURFACE MOUNT EMISSIVE ELEMENTS, filed on Jan. 19, 2017.

Ser. No. 15/410,001 is a Continuation-in-part of application Ser. No. 14/749,569, invented by Sasaki et al., entitled LIGHT EMITTING DEVICE AND FLUIDIC MANUFACTURE THEREOF, filed on Jun. 24, 2015.

Ser. No. 15/410,001 is a Continuation-in-part of application Ser. No. 15/221,571, invented by Crowder et al., entitled SUBSTRATE WITH TOPOLOGICAL FEATURES FOR STEERING FLUIDIC ASSEMBLY LCD DISKS, filed on Jul. 27, 2016.

Ser. No. 15/410,001 is a Continuation-in-part of application Ser. No. 15/197,226, invented by Kurt Ulmer, entitled LAMINATED PRINTED COLOR CONVERSION PHOSPHOR SHEETS, filed on Jun. 26, 2016.

Ser. No. 15/410,001 is a Continuation-in-part of application Ser. No. 15/190,813, invented by Schuele et al., entitled DIODES OFFERING ASYMMETRIC STABILITY DURING FLUIDIC ASSEMBLY, filed on Jun. 23, 2016.

Ser. No. 15/410,001 is a Continuation-in-part of application Ser. No. 15/158,556, invented by Zhan et al., entitled FORMATION AND STRUCTURE OF POST ENHANCED DIODES FOR ORIENTATION CONTROL, filed on May 18, 2016.

Ser. No. 15/410,001 is a Continuation-in-part of application Ser. No. 15/266,796, invented by Heine et al., entitled SUBSTRATE FEATURES FOR ENHANCED FLUIDIC ASSEMBLY OF ELECTRONIC DEVICES, filed on Sep. 15, 2016.

Ser. No. 15/410,001 is a Continuation-in-part of application Ser. No. 14/680,618, invented by Zhan et al., entitled FLUIDIC ASSEMBLY TOP-CONTACT DISK, filed on Apr. 7, 2015:

which is a Continuation-in-part of application Ser. No. 14/540,230, invented by Zhan et al., entitled COUNTER-BORE POCKET STRUCTURE FOR FLUIDIC ASSEMBLY, filed on Oct. 31, 2014.

All the above-listed applications are incorporated herein by reference.

BACKGROUND OF THE INVENTION

1. Field of the Invention

This invention generally relates to emissive displays and, more particularly, to a light management system for an emissive display made using the micro-size emissive elements.

2. Description of the Related Art

A red-green-blue (RGB) display can be made with micro-sized emissive elements, such as a micro light emitting diode (μLED). Such a display might be used in a television, computer monitor, or handheld device. Micro-sized emissive elements may have a diameter or cross-section of less than 100 microns. The emissive elements are aligned in some manner into pixel arrays. Conventional processing and integration steps following the placement of emissive elements include metallization to connect the emissive elements to a matrix of control lines.

If the display is fabricated using a fluidic fabrication process, the display substrate is formed with an array of wells to capture the emissive elements. Typically, the display substrate is made of a transparent material such as glass. As a result, light can leak propagate through the transparent substrate between adjacent wells, which degrades color quality and contrast.

It would be advantageous if the light emission from each emissive substrate well could be controlled such that light from the emissive elements in wells is only directed to the top surface of a transparent surface, and prevented from propagating into adjacent wells.

SUMMARY OF THE INVENTION

Described herein are structural features used with direct emitting emissive elements, such as micro light emitting diodes (uLEDs), which control the directionality of light emitted. An emissive display may be composed of a multitude of uLED pixels; each one addressed individually. It is important that the direction of the light emitted by each uLED is controlled to reduce light leakage between pixels to ensure color quality and contrast. The light from each uLED is emitted from all surfaces including the faces and the sides and is thus emitted in directions perpendicular and parallel to the surface of the display. Unless controlled, the light emitted along the direction nominally parallel to a transparent display substrate surface will propagate to adjacent pixels. The structure features described herein are used to reflect or absorb this light. Reflective materials may include metals already incorporated into the backplane manufacturing, including aluminum, titanium, silver, tin, indium, nickel, gold, or other reflective metals. Absorptive materials may include black polymer resin and black photoresist materials containing carbon black or graphene oxide.

Accordingly, a method is provided for fabricating an emissive display substrate with a light management system. The method provides a transparent first substrate with a top surface and forms a plurality of emissive element wells. The well sidewalls are formed from a light blocking material. In the simplest case, the wells are formed in the first substrate. As mentioned above, the light blocking material may be a light absorbing material or a light reflector material. In one aspect, a light blocking material film layer is formed overlying the first substrate top surface, and the emissive element sidewalls are formed in the light blocking material film layer.

In another aspect, a transparent second substrate is formed overlying the first substrate top surface. Then, the emissive element wells are formed in the second substrate with via surfaces, and the light blocking material is deposited overlying the well via surfaces. Additionally, the light blocking material may be formed on the bottom surface of each well. If the first substrate includes electrical interfaces formed on the top surface, the emissive element wells formed in the second substrate are etched to expose an electrical interface formed on each well bottom surface. Then, the light blocking material on the well bottom surface is patterned to avoid the electrical interface formed on the well bottom surface.

In another aspect, prior to depositing the light blocking material, a fluidic assembly process is used to populate the wells with emissive elements. Note, the wells can also be populated using a pick-and-place process, which is inherently more time consuming. The well sidewall light blocking material is then formed by conformally depositing the light absorbing blocking material overlying the second substrate top surface and filling the wells, and etching the light absorbing blocking material to expose the emissive elements.

Additional details of the above-described method and an emissive display substrate with light management system are provided below.

DETAILED DESCRIPTION

Figure 1:
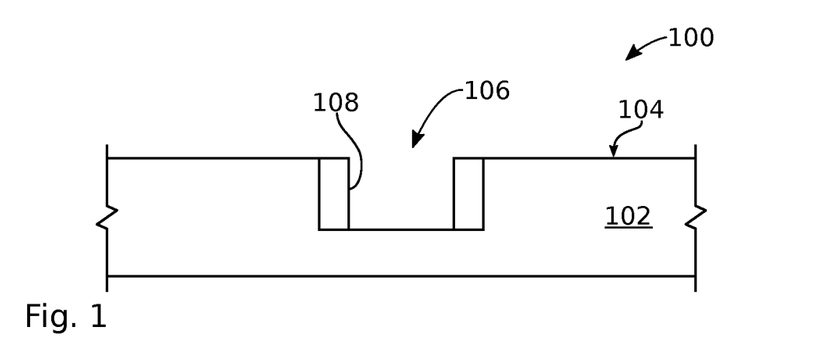
FIG. 1 is a partial cross-sectional view of an emissive display substrate with a light management system.

FIG. 1 is a partial cross-sectional view of an emissive display substrate with a light management system. The display 100 comprises a first substrate 102 with a first substrate top surface 104. For example, the first substrate 102 may be a transparent material such as glass or plastic, but alternatively the material be a non-transparent plastic, metal, or silicon material. A plurality of emissive element wells 106 exists (one well is shown), with well sidewalls formed from a light blocking material 108. In one simple aspect as shown, the wells 106 are formed directly in the first substrate 102. The light blocking material may be either a light absorbing material or a light reflector material. Some examples of a light absorber material include a black polymer resin, a black photoresist, a material comprising carbon black, or a material comprising graphene oxide. Some examples of a light reflector material include aluminum, titanium, silver, tin, indium, nickel, and gold. Advantageously, these materials are commonly used in thin-film display and integrated circuit (IC) fabrication processes. In one aspect, for example see FIG. 8, the well via surfaces and sidewalls are sloped.

Figure 2:
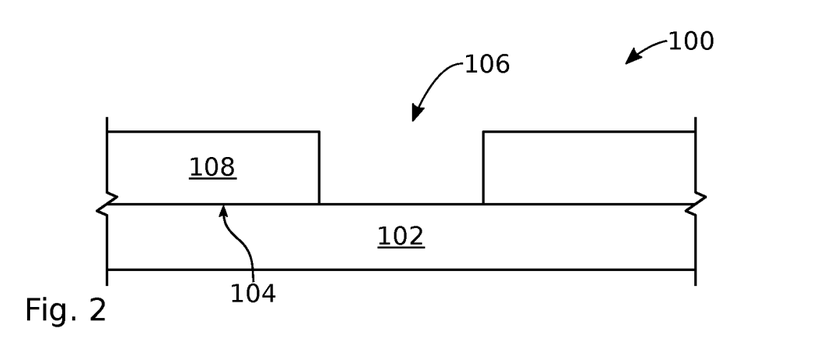
FIG. 2 is a partial cross-sectional view depicting a first variation of the light management system.

FIG. 2 is a partial cross-sectional view depicting a first variation of the light management system. In this aspect, the light blocking material forms a film layer 108 overlying the first substrate top surface 104. The wells 106 are formed in the light blocking material film layer 108. Although not shown, the light blocking film layer need not necessary be etched to expose the first substrate top surface when the well is formed.

Figure 3:
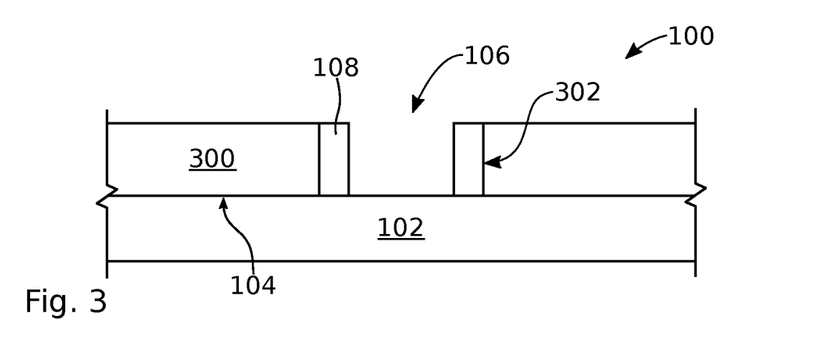
FIG. 3 is a partial cross-sectional view depicting a second variation of the light management system.

FIG. 3 is a partial cross-sectional view depicting a second variation of the light management system. In this aspect, a transparent second substrate 300 with a top surface 302 overlies the first substrate top surface 104. The wells 106 are formed in the second substrate 300 with well via surfaces 302, and light blocking material sidewalls 108 overlie the well via surfaces. Although not shown, the second substrate need not necessary be etched to expose the first substrate top surface when the well is formed.

Figure 4A:
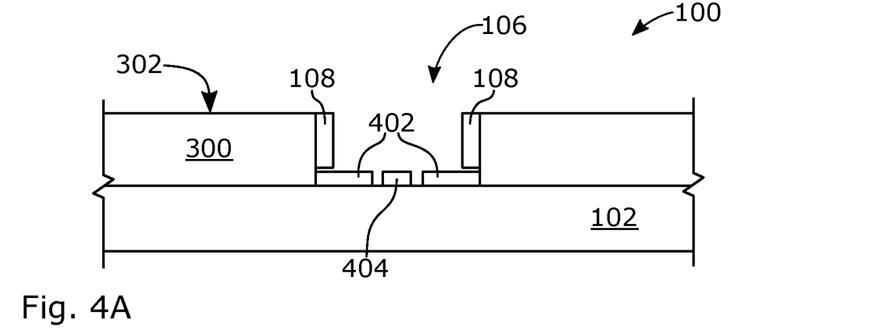
FIGS. 4A and 4B are, respectively, partial cross-sectional and plan views related to the second variation of light management system present in FIG. 3.
Figure 4B:
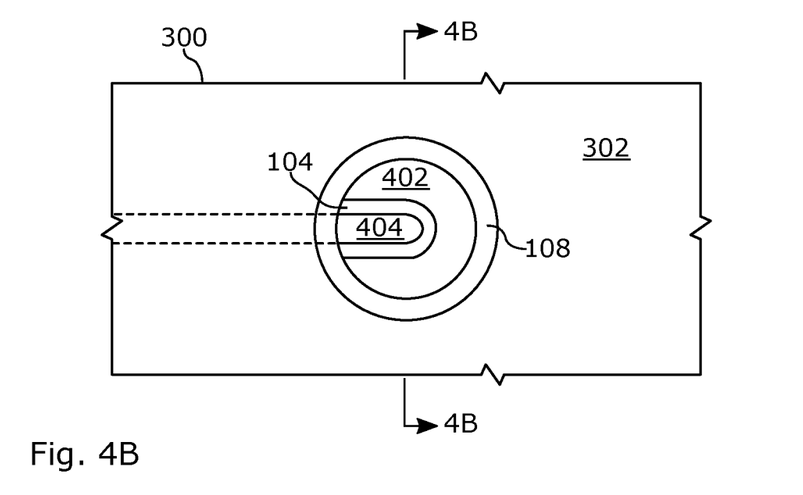

FIGS. 4A and 4B are, respectively, partial cross-sectional and plan views related to the second variation of light management system present in FIG. 3. In this aspect, the light blocking material 402 is formed on a bottom surface 400 of each well 106. Note, light blocking material 402 and 108 are typically the same material formed in the same process, but have been given different reference designators for the purpose of clarity. Although not shown, the second substrate need not necessary be etched to expose the first substrate top surface when the well is formed.

If an electrical interface 404 is formed on each well bottom surface 400, as shown in FIG. 4B, the light blocking material 402 on the bottom surface 400 of each well is patterned to avoid the electrical interface formed on the well bottom surface. In this example the well is shown as having a circular shape, but other shapes (e.g., square, rectangular, oval, etc.) are also possible. Although not shown, each well may include an additional electrical interface that would be exposed by the patterning of the light blocking material 402.

Figure 5A:
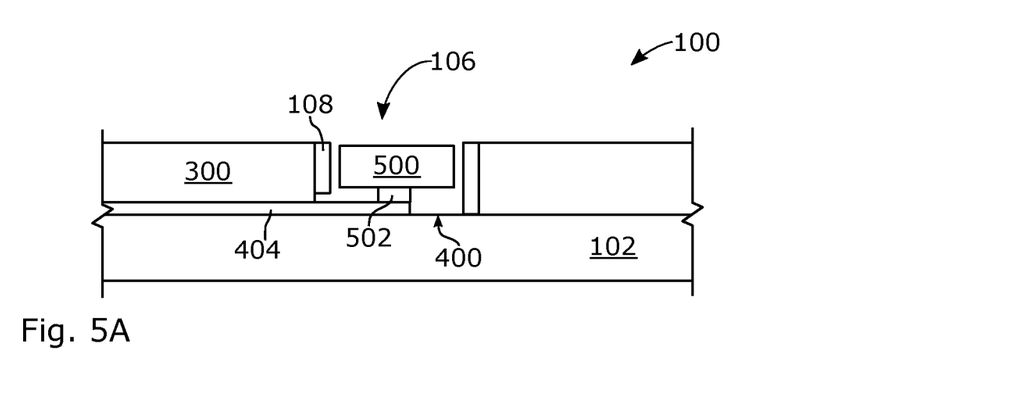
FIGS. 5A and 5B are partial cross-sectional views depicting the display light management system subsequent to the addition of emissive elements.
Figure 5B:
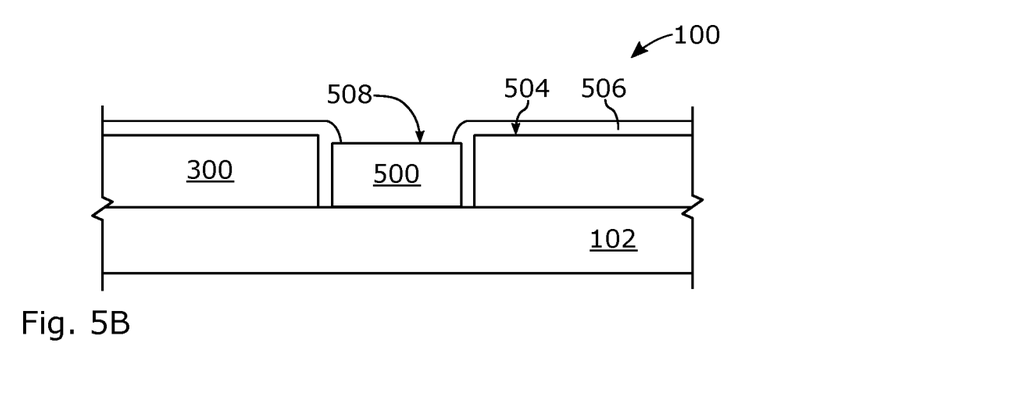

FIGS. 5A and 5B are partial cross-sectional views depicting the display light management system subsequent to the addition of emissive elements. In this aspect, the display 100 further comprises emissive elements 500 populating the wells 106. Optionally, as shown in FIG. 5A, if the wells 106 include an electrical interface 404 formed on each well bottom surface 400, the emissive elements 500 each have an electrical contact 502 connected to the electrical interface formed on the well bottom surfaces. In some aspects not shown, the well bottom surface includes two electrical interfaces and the emissive element includes two electrical contacts. Although a second transparent substrate 300 is used in this example, with light blocking sidewalls 108, alternatively, the light blocking sidewalls can be formed from a light blocking film layer, as shown in FIG. 2

As shown in FIG. 5B, wells 106 are formed in the top surface 504 of second substrate 300. Absorbing type light blocking material 506 overlies the second substrate top surface 504 and forms the well sidewalls. Absorbing type light blocking material 506 is patterned to expose a top surface 508 of each emissive element 500.

The variations presented above describe structural elements employed within a direct emitting emissive element display to control the directionality of the light emitted by the emissive element. One example of an emissive element is a micro light emitting diode (uLED). The display is comprised of a multitude of uLED pixels; each one addressed individually. It is important that the direction of the light emitted by each uLED is controlled to reduce light leakage between pixels to ensure color quality and contrast. The light from each uLED is emitted from all surfaces including the faces and the sides and is thus emitted in directions perpendicular and parallel to the surface of the display substrate. The light emitted along the direction nominally parallel to the surface would propagate to adjacent pixels without a structure to reflect or absorb this light. These structural elements are either an absorbing or reflecting type. Reflective materials that can be used include metals already incorporated into the backplane manufacturing including aluminum, titanium, silver, tin, indium, nickel, gold or other reflective metals. Absorptive materials include black polymer resin and black photoresist materials containing carbon black or graphene oxide.

Figure 6:
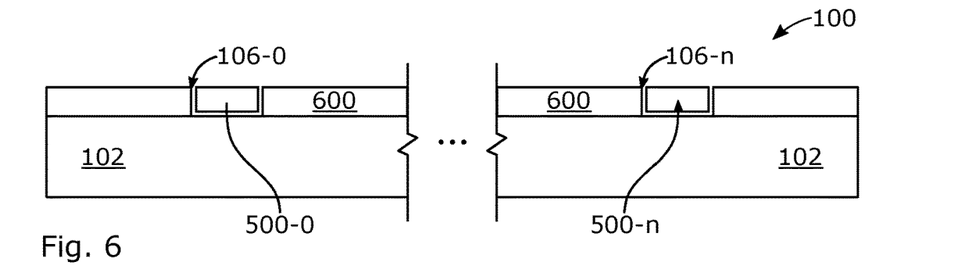
FIG. 6 is a partial cross-sectional diagram of the light management feature enabled as a well structure created from a reflective material.

FIG. 6 is a partial cross-sectional diagram of the light management feature enabled as a well structure created from a reflective material. Shown are wells 106-0 and 106-n. This reflective material could be metal for example. A substrate 102 such as glass is supplied onto which a metal electrode may be patterned (not shown) by standard photolithographic methods. A reflective well layer 600 is deposited several microns in thickness with exact thickness determined by the thickness of the emissive elements (500-0 and 500-n). The reflective well layer 600 is patterned by photolithographic methods forming wells 106-0 and 106-n. Emissive elements 500-0 and 500-n may be fluidically assembled into the well structure, and if electrical interfaces exist on the well bottom layer (not shown), they are connected to the emissive elements through a solder process.

Figure 7:
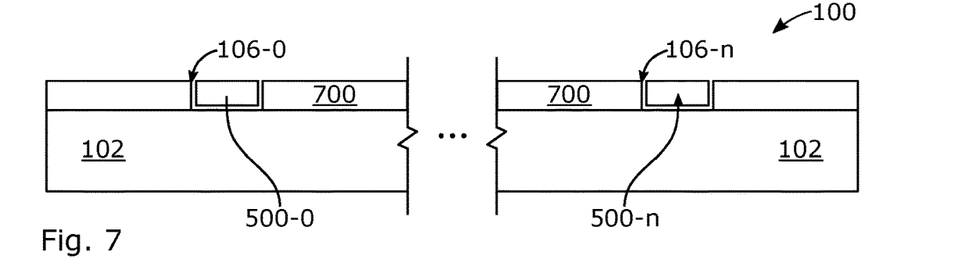
FIG. 7 is a partial cross-sectional view depicting a light management feature enabled as a well structure created from a light absorbing material.

FIG. 7 is a partial cross-sectional view depicting a light management feature enabled as a well structure created from a light absorbing material. This absorbing material could be black matrix material for example. A substrate 102 such as glass is supplied onto which a metal electrode (not shown) may be patterned by standard photolithographic methods. An absorbing well layer 700 is deposited several microns in thickness with the exact thickness determined by the thickness of the emissive element. The absorbing well layer 700 is patterned by photolithographic methods to form wells 106-0 and 106-n. Emissive elements 500-0 and 500-n are fluidically assembled into the well structures 106-0 and 106-n, respectively, and if electrical interfaces exist on the well bottom layer (not shown), they are connected to the emissive elements through a solder process.

Figure 8:
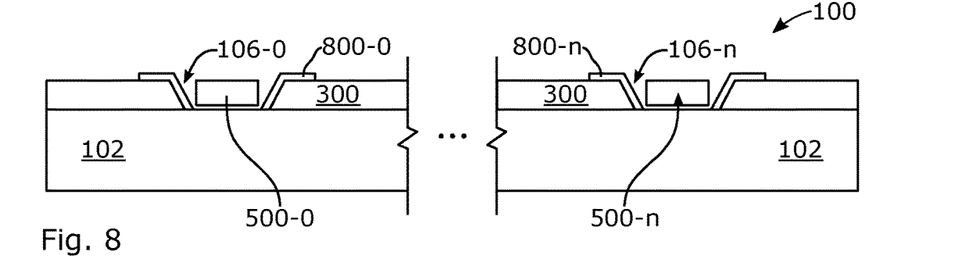
FIG. 8 is a partial cross-sectional view depicting the light management feature enabled as a well structure coated with a light reflecting material.

FIG. 8 is a partial cross-sectional view depicting the light management feature enabled as a well structure coated with a light reflecting material. This reflecting material could be a metal for example. A substrate such as glass 102 is supplied onto which a metal electrode (not shown) may be patterned by standard photolithographic methods. Well pattern layer 300, typically made from a transparent material, is deposited to be several microns in thickness with the exact thickness determined by the thickness of the emissive element. The well pattern layer 300 is patterned by photolithographic methods to form wells 106-0 and 106-n. A reflective coating 800-0 and 800-n is respectively deposited on well structures 106-0 and 106-n through an evaporation or sputter process for example. The reflective coatings 800-0 and 800-n are patterned by photolithographic methods. Emissive elements 500-0 and 500-n are fluidically assembled into the well structures 106-0 and 106-n, and if electrical interfaces exist on the well bottom layer (not shown), they are connected to the emissive elements through a solder process.

Figure 9:
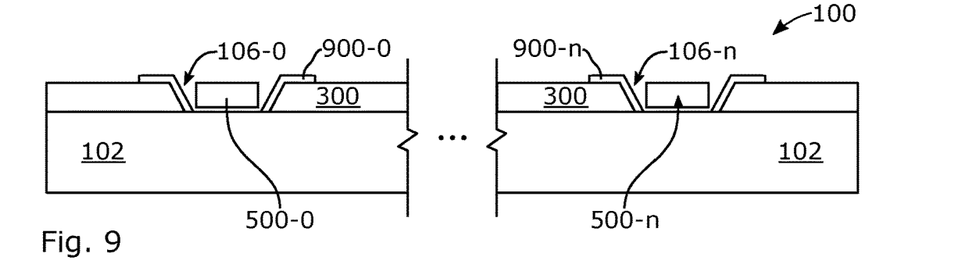
FIG. 9 is a partial cross-sectional view of the light management feature enabled a well structure coated with a light absorbing material.

FIG. 9 is a partial cross-sectional view of the light management feature enabled a well structure coated with a light absorbing material. This absorbing material may be a black matrix material for example. A substrate 102 such as glass is supplied onto which a metal electrode (not shown) is optionally patterned by standard photolithographic methods. A transparent well pattern layer 300 is deposited several microns in thickness with the exact thickness determined by the thickness of the emissive element. The well layer 300 is patterned by photolithographic methods to form wells 106-0 and 106-n. An absorbing coating 900-0 and 900-n is deposited, respectively on well structures 106-0 and 106-n. The absorbing coating is patterned by photolithographic methods. Emissive elements 500-0 and 500-n are fluidically assembled, respectively, into the well structures 106-0 and 106-n, and if electrical interfaces exist on the well bottom layer (not shown), they are connected to the emissive elements through a solder process.

Figure 10:
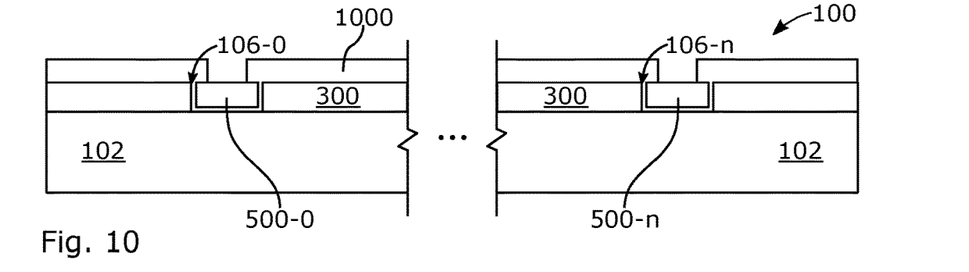
FIG. 10 is a partial cross-sectional view depicting the light management feature enabled as a well structure, with emissive elements overcoated with a light absorbing layer.

FIG. 10 is a partial cross-sectional view depicting the light management feature enabled as a well structure, with emissive elements overcoated with a light absorbing layer. This absorbing material 1000 can be a black matrix material for example. A substrate 102 such as glass is supplied onto which a metal electrode (not shown) is optionally patterned by standard photolithographic methods. A transparent well pattern layer 300 is deposited several microns in thickness with the exact thickness determined by the thickness of the emissive element. The well layer 300 is patterned by photolithographic methods to form wells 106-0 and 106-n. Emissive elements 500-0 and 500-n are fluidically assembled, respectively into the well structures 106-0 and 106-n, and if electrical interfaces exist on the well bottom layer (not shown), they are connected to the emissive elements through a solder process. The absorbing coating 1000 is deposited on a well structure. The absorbing coating 1000 is patterned by photolithographic methods.

Figure 11:
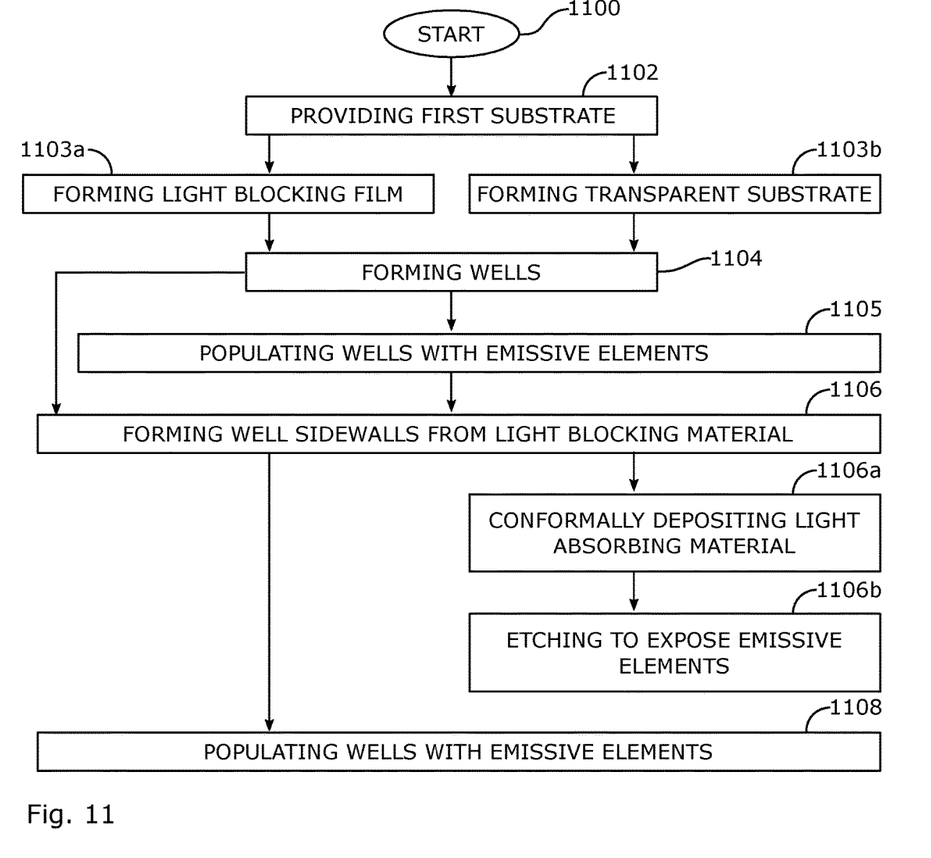
FIG. 11 is a flowchart illustrating a method for fabricating an emissive display substrate with a light management system.

FIG. 11 is a flowchart illustrating a method for fabricating an emissive display substrate with a light management system. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. Generally however, the method follows the numeric order of the depicted steps. The method starts at Step 1100.

Step 1102 provides a transparent first substrate with a top surface. Step 1104 forms a plurality of emissive element wells, and Step 1106 forms well sidewalls from a light blocking material. As noted above, the blocking material may be a light absorbing material such as a black polymer resin, a black photoresist, a material comprising carbon black, or a material comprising graphene oxide. Otherwise, the light blocking material is a light reflector material such as aluminum, titanium, silver, tin, indium, nickel, and gold. In one aspect, the wells are formed directly in the first substrate. In another aspect, forming the emissive element wells in Step 1104 includes forming wells with sloped via surfaces, and forming well sidewalls in Step 1106 includes forming sloped well sidewalls.

In one aspect, Step 1103a forms a light blocking material film layer overlying the first substrate top surface. Then, forming well sidewalls in Step 1106 includes forming the emissive element sidewalls in the light blocking material film layer. In this aspect, Step 1108 may use a fluidic assembly process to populate the emissive element wells with emissive elements. Alternatively, a pick-and-place process can be used to populate the wells.

In another aspect, Step 1103b forms a transparent second substrate overlying the first substrate top surface. Then, forming the emissive element wells in Step 1104 includes forming the emissive element wells in the second substrate with via surfaces, and forming the well sidewalls in Step 1106 includes depositing the light blocking material overlying the well via surfaces. Optionally, Step 1106 may form the light blocking material on a bottom surface of each well. If Step 1102 provides the first substrate with electrical interfaces formed on the first substrate top surface, then forming the emissive element wells in Step 1104 includes etching the second substrate to expose an electrical interface formed on each well bottom surface. Similarly, forming the light blocking material on the bottom surface of each well in Step 1106 would then include patterning the light blocking material to avoid the electrical interface formed on the well bottom surface. In this aspect, Step 1108 uses a fluidic assembly process to populate the emissive element wells with emissive elements. Alternatively, a pick-and-place process can be used to populate the wells.

In another aspect using the transparent second substrate, Step 1105 uses a fluidic assembly process to populate the wells with emissive elements prior to depositing the light blocking material. Then, forming well sidewalls from a light blocking material includes substeps. Step 1106*a* conformally deposits a light absorbing blocking material overlying the second substrate top surface and filling the wells, and Step 1106*b* etches the light absorbing blocking material to expose the emissive elements.

Figure 12:
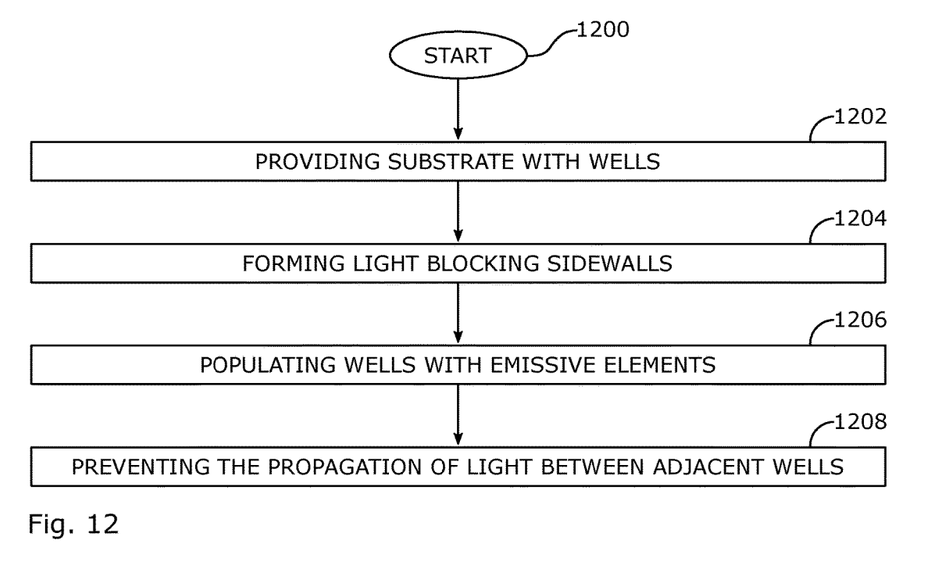
FIG. 12 is a flowchart illustrating a method for managing the direction of light emitted from an emissive display substrate.

FIG. 12 is a flowchart illustrating a method for managing the direction of light emitted from an emissive display substrate. The method begins at Step 1200. Step 1202 provides a transparent substrate and a plurality of emissive element wells. Step 1204 forms light blocking material well sidewalls and Step 1206 populates the wells with emissive elements using a fluidic (or pick-and-place) assembly process. As noted in the explanation of FIG. 11, in some aspects Step 1206 may be performed before Step 1204. In response to the light blocking material sidewalls, Step 1208 prevents the propagation of light between adjacent wells.

An emissive display light management system has been provided. Examples of particular material, circuit layouts, and process steps have been presented to illustrate the invention. However, the invention is not limited to merely these examples. Other variations and embodiments of the invention will occur to those skilled in the art.

We claim:

1. An emissive display substrate with a light management system comprising:
   a transparent first substrate;
   a first substrate planar top surface;
   an array of emissive element wells formed in the first substrate planar top surface;
   well sidewalls formed in the emissive element wells from a light blocking material;
   a plurality of emissive elements, each emissive element populating a corresponding emissive element well, and each emissive element comprising;
      a top surface overlying a corresponding well bottom surface;
      a bottom surface; and,
      a post extending from the emissive element bottom surface.

2. The emissive display substrate of claim 1 wherein the light blocking material is selected from the group consisting of a light absorbing material and a light reflector material.

3. The emissive display substrate of claim 2 wherein the light absorber material is selected from a group consisting of a black polymer resin, a black photoresist, a material comprising carbon black, and a material comprising graphene oxide.

4. The emissive display substrate of claim 2 wherein the light reflector material is selected from a group consisting of aluminum, titanium, silver, tin, indium, nickel, and gold.

5. The emissive display substrate of claim 1 wherein the well sidewalls are sloped.

6. The emissive display substrate of claim 1 wherein the wells include an electrical interface formed on each well bottom surface; and,
   wherein the emissive elements each have an electrical contact connected to the electrical interface formed on the well bottom surfaces.

7. The emissive display substrate of claim 1 wherein the wells include a first electrical interface and a second electrical interface formed on each well bottom surface; and,
   wherein the emissive elements each have a first electrical contact and a second electrical contact respectively connected to the first and second electrical interfaces formed on the well bottom surfaces.

8. An emissive display substrate with a light management system comprising:
   a transparent first substrate;
   a first substrate top surface;
   a light blocking film layer overlying the first substrate top surface;
   a light blocking film layer planar top surface;
   an array of emissive element wells formed in the light blocking film layer planar top surface;
   well sidewalls formed in the emissive element wells from a light blocking material;
   a plurality of emissive elements, each emissive element populating a corresponding emissive element well, and each emissive element comprising;
      a top surface overlying a corresponding well bottom surface;
      a bottom surface; and,
      a post extending from the emissive element bottom surface.

9. The emissive display substrate of claim 8 wherein the light blocking film material is selected from the group consisting of a light absorbing material and a light reflector material.

10. The emissive display substrate of claim 9 wherein the light absorber material is selected from a group consisting of a black polymer resin, a black photoresist, a material comprising carbon black, and a material comprising graphene oxide.

11. The emissive display substrate of claim 9 wherein the light reflector material is selected from a group consisting of aluminum, titanium, silver, tin, indium, nickel, and gold.

12. The emissive display substrate of claim 8 wherein the well sidewalls are sloped.

13. The emissive display substrate of claim 8 wherein the wells include an electrical interface formed on each well bottom surface; and,
   wherein the emissive elements each have an electrical contact connected to the electrical interface formed on the well bottom surfaces.

14. The emissive display substrate of claim 8 wherein the wells include a first electrical interface and a second electrical interface formed on each well bottom surface; and,
   wherein the emissive elements each have a first electrical contact and a second electrical contact respectively connected to the first and second electrical interfaces formed on the well bottom surfaces.

15. An emissive display substrate with a light management system comprising:
   a transparent first substrate;
   a first substrate top surface;
   a transparent second substrate overlying the first substrate top surface;

a second substrate planar top surface;
an array of emissive element wells formed in the second substrate planar top surface;
a light blocking material formed on emissive element well sidewalls and on a bottom surface of each well;
a plurality of emissive elements, each emissive element populating a corresponding emissive element well, and each emissive element comprising;
  a top surface overlying a corresponding well bottom surface;
  a bottom surface; and,
  a post extending from the emissive element bottom surface.

16. The emissive display substrate of claim 15 wherein the wells include an electrical interface formed on each well bottom surface; and,
wherein the light blocking material on the bottom surface of each well is patterned to avoid the electrical interface formed on the well bottom surface.

17. The emissive display substrate of claim 16 wherein the emissive elements each have an electrical contact connected to the electrical interface formed on the well bottom surfaces.

18. The emissive display substrate of claim 15 wherein the light blocking film material is selected from the group consisting of a light absorbing material and a light reflector material.

19. The emissive display substrate of claim 18 wherein the light absorber material is selected from a group consisting of a black polymer resin, a black photoresist, a material comprising carbon black, and a material comprising graphene oxide.

20. The emissive display substrate of claim 18 wherein the light reflector material is selected from a group consisting of aluminum, titanium, silver, tin, indium, nickel, and gold.

21. The emissive display substrate of claim 15 wherein the wells include a first electrical interface and a second electrical interface formed on each well bottom surface;
wherein the emissive elements each have a first electrical contact and a second electrical contact respectively connected to the first and second electrical interfaces formed on the well bottom surfaces; and,
wherein the light blocking material on the bottom surface of each well is patterned to avoid the first and second electrical interfaces formed on the well bottom surface.

22. An emissive display substrate with a light management system comprising:
a transparent first substrate;
a first substrate top surface;
a transparent second substrate overlying the first substrate top surface;
a second substrate planar top surface;
an array of emissive element wells formed in the second substrate planar top surface;
emissive elements populating the wells, each emissive element comprising;
  a top surface overlying a corresponding well bottom surface;
  a bottom surface; and,
  a post extending from the emissive element bottom surface; and,
a light blocking material overlying the second substrate top surface, forming well sidewalls and patterned to expose the bottom surface of each emissive element.

23. The emissive display substrate of claim 22 wherein the wells include an electrical interface formed on each well bottom surface.

24. The emissive display substrate of claim 22 wherein the light blocking film material is selected from the group consisting of a light absorbing material and a light reflector material.

25. The emissive display substrate of claim 24 wherein the light absorber material is selected from a group consisting of a black polymer resin, a black photoresist, a material comprising carbon black, and a material comprising graphene oxide.

26. The emissive display substrate of claim 24 wherein the light reflector material is selected from a group consisting of aluminum, titanium, silver, tin, indium, nickel, and gold.

* * * * *

UNITED STATES PATENT AND TRADEMARK OFFICE
CERTIFICATE OF CORRECTION

PATENT NO. : 10,236,279 B2
APPLICATION NO. : 15/410195
DATED : March 19, 2019
INVENTOR(S) : Kurt Ulmer et al.

Page 1 of 1

It is certified that error appears in the above-identified patent and that said Letters Patent is hereby corrected as shown below:

In the Specification

Column 1, Lines 6 through 46, should read:
Any and all applications, if any, for which a foreign or domestic priority claim is identified in the Application Data Sheet of the present application are hereby incorporated by reference under 37 CFR 1.57.

Signed and Sealed this
Twenty-eighth Day of April, 2020

Andrei Iancu
*Director of the United States Patent and Trademark Office*